United States Patent [19]

Cline et al.

[11] 3,898,106

[45] Aug. 5, 1975

[54] HIGH VELOCITY THERMOMIGRATION METHOD OF MAKING DEEP DIODES

[75] Inventors: Harvey E. Cline; Thomas R. Anthony, both of Schenectady, N.Y.

[73] Assignee: General Electric Company, Schenectady, N.Y.

[22] Filed: Oct. 30, 1973

[21] Appl. No.: 411,015

[52] U.S. Cl. ................. 148/1.5; 148/171; 148/172; 148/173; 148/186; 148/187; 148/188; 148/177; 148/179; 252/62.3 E; 252/62.3 GA

[51] Int. Cl. ............................................. H01l 7/34

[58] Field of Search..... 148/1.5, 177, 179, 171–173, 148/186–188; 252/62.3 GA, 62.3 E

[56] References Cited

UNITED STATES PATENTS

| | | | |
|---|---|---|---|
| 2,813,048 | 11/1957 | Pfann | 148/1 |
| 3,205,101 | 9/1965 | Mlavsky et al. | 148/171 |
| 3,360,851 | 1/1968 | Kahng et al. | 148/188 X |
| 3,484,302 | 12/1969 | Maeda et al. | 148/1.5 |
| 3,671,339 | 6/1972 | Tateno et al. | 148/179 |

*Primary Examiner*—G. Ozaki
*Attorney, Agent, or Firm*—Charles T. Watts; Joseph T. Cohen; Jerome C. Squillaro

[57] ABSTRACT

By carrying out the thermal gradient zone melting process at temperatures which are much higher than those previously used, the rate of droplet migration through a crystal of semiconducting material can be increased by an order of magnitude or more.

10 Claims, 12 Drawing Figures

HIGH VELOCITY THERMOMIGRATION METHOD OF MAKING DEEP DIODES

This invention concerns the art of temperature gradient zone melting and more particularly relates to a novel method for making deep diodes by thermomigrating a liquid body or droplet at high velocity through a semiconductor matrix body at a temperature relatively high and even approaching the melting-point temperature of that body.

CROSS REFERENCES

This invention is related to those of the following patent applications assigned to the assignee hereof and filed of even date herewith:

Patent application Ser. No. 411,150, filed Oct. 30, 1973, entitled "Method of Making Deep Diode Devices" in the names of Thomas R. Anthony and Harvey E. Cline, which discloses and claims the concept of embedding or depositing the solid source of the migrating species within the matrix body instead of on that body to overcome the tendency for migration to be irregular and to lead to non-uniformity in location and spacing of the desired P-N junctions.

Patent application Ser. No. 411,021, filed Oct. 30, 1973, entitled "Deep Diode Device Production Method" in the names of Harvey E. Cline and Thomas R. Anthony, which discloses and claims the concept of using the high velocity thermomigration method to produce migration trails of recrystallized material running lengthwise of an elongated matrix body and then dividing the matrix into a number of similar deep diodes by cutting the matrix body transversely at locations along the length of the migration trails.

Patent application Ser. No. 411,001, filed Oct. 30, 1973, entitled "Deep Diode Devices and Method and Apparatus" in the names of Thomas R. Anthony and Harvey E. Cline, which discloses and claims the concept of carrying out thermal gradient zone melting under conditions such that heat flow through the workpiece is unidirectional.

Patent application Ser. No. 411,009, filed Oct. 30, 1973, entitled "Deep Diode Device Having Dislocation-Free P-N Junctions and Method" in the names of Thomas R. Anthony and Harvey E. Cline, which discloses and claims the concept of minimizing the random walk of a migrating droplet in a thermal gradient zone melting operation by maintaining a thermal gradient a few degrees off the [100 axial direction of the crystal matrix body and thereby overwhelming the detrimental dislocation intersection effect.

Patent application Ser. No. 411,008, filed Oct. 30, 1973, entitled "The Stabilized Droplet Method of Making Deep Diodes Having Uniform Electrical Properties" in the names of Harvey E. Cline and Thomas R. Anthony, which discloses and claims the concept of controlling the cross-sectional size of a migrating droplet on the basis of the discovery that one millimeter is the critical thickness dimension for droplet physical stability.

BACKGROUND OF THE INVENTION

It has been generally recognized that semi-conductor diode devices which have substantial depth beyond that readily achievable in the planar geometry presently in general use would offer important advantages to the user. Thus, shallow diode arrays produced on the surface of thin wafer silicon by diffusion or epitaxial techniques and used for imaging are not capable of use in the X-ray and infrared radiation regions because of the low absorption constant of silicon for such radiation. While a thick target could compensate for this shortcoming of silicon, resolution in the shallow diode array geometry would be lost by diffusion and smearing out of electrons and holes parallel to the target surface before reaching the shallow surface diodes from generation points within the target bulk. But if use could be made of deep diode geometry, both high sensitivity (because of target thickness) and good resolution (because of the detecting diodes deep within the target bulk) might be achieved.

Although efforts in the prior art to produce deep diode arrays have not been successful enough for general application, it was established that the thermomigration technique described by W G. Pfann in U.S. Pat. No. 2,813,048, issued Nov. 12, 1957, was a much more rapid process of device production than the diffusion method used in commercial manufacturing operations. The difference in rate was actually of the order of a thousand fold ($10^{-3}$ centimeter per day to one centimeter per day). Even so, there were efforts made by those trying to overcome the obstacles to practical use of thermal gradient zone melting or thermomigration to still further substantially increase the production rate. However, these efforts, like all those heretofore directed at meeting the important problems solved by the inventions disclosed and claimed in several of the above-identified copending cases, were unsuccessful.

SUMMARY OF THE INVENTION

We have discovered that this production rate problem can be solved by doing something which was not previously known or recognized as having significant effect on the thermomigration rate. In fact, classical knowledge in the art led to the conclusion that such a measure would not significantly influence the speed of migration travel of a liquid body through a semiconductor material matrix and thus turned the prior art away from the direction taken by the applicants in making this discovery.

On the basis of our discovery, it is our concept to raise the temperature at which thermomigration is carried out considerably above the melting point temperature of the migrating species and preferably to a level approaching the melting point temperature of the matrix material. Surprisingly, this results in a spectacular increase in the rate of droplet migration up to an order of magnitude greater than the best prior art rate.

This new result can in retrospect be explained on the basis of the previously unknown and unrecognized fact that at high temperatures the equation for droplet migration must be modified to include both the variation in the change of composition of droplet liquid and the physical flow of liquid that occurs across a droplet during migration. Since the transport of dissolved solid atoms across the droplet was limited ultimately by the magnitude of the liquid diffusion coefficient and since relatively high temperature effects on the equation were not foreseen, it had been assumed in the prior art that high temperatures would have no relieving effect upon the slow rate of travel problem and, prior to our discovery, definitive experiments were not attempted at relatively high matrix body temperatures.

We have further determined that this invention is generally applicable to semiconductor materials suitable for deep diode production. Also, we have found that this invention is independent of droplet volume, geometrical form and diameter, as well as the environment in which the thermomigration operation is conducted and the type of primary heat source employed in the process.

DESCRIPTION OF THE DRAWINGS

Novel features of the invention are illustrated in the drawings accompanying and forming a part of this specification, in which.

DETAILED DESCRIPTION OF THE INVENTION

Figure 1:
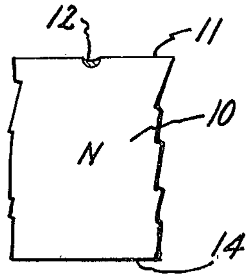
FIG. 1 is a series of diagrammatic views of a deep diode semiconductor device at various stages of the thermomigration process of this invention.

The process of this invention comprises several separate steps, the first being to provide in contact with a first portion of a matrix body of semiconductor material a plurality of separate deposits of a second material which is fusible and will form with the matrix material a solution of melting point temperature below that of the matrix material. As the next step, the matrix body is heated so that a portion of that body spaced from the deposits of the second fusible material is raised to a temperature within about 250°C of the melting point temperature of the matrix body. The fusible second material is simultaneously heated so that a body of liquid solution forms at the site of each separate deposit, and the temperatures of both parts of the matrix are maintained and a thermal gradient is maintained between them. The resulting liquid bodies then migrate from the point of deposit toward the hottest portion of the matrix body at the rate of at least $2 \times 10^{+5}$ centimeters per second.

As used herein and in the appended claims, the term "droplets" means and includes small, individual drops above or disposed as ordered arrays in the matrix as well as lines, i.e., elongated droplets which on migrating produce a planar trail of recrystallized material instead of the column-like trail of such material typical of the migrated small droplet.

Preferably, the matrix body is a silicon single crystal which may be appropriately doped as with phosphorus but it may alternatively be silicon carbide, germanium, gallium arsenide or other semiconductor material in doped or undoped condition. The deposited or second fusible material is preferably aluminum and it likewise may be doped for particular end-product characteristics. Gallium, tin, indium, or gold may be used as an alternative to aluminum. This second fusible material, however, must be one which has a melting point temperature below, and preferably substantially below, that of the matrix body and it must be one which on melting will form a solution with the matrix body of lower melting point temperature than the melting point temperature of the matrix body.

As applied to a silicon matrix body, the present invention process will involve the use of a temperature between 1150° and 1400°C, preferably between 1300° and 1350°C. This will represent the hottest portion of the silicon single crystalline wafer or other shape and the thermal gradient between that portion of the matrix and the portion in which the aluminum deposits are provided will be established and maintained between 10° and 100°C per centimeter and preferably of the order of about 50°C per centimeter during thermal migration.

Also, according to this invention, the source of the liquid body of second fusible material, such as aluminum, may range from about $10^{-9}$ cubic centimeters to about $10^{-4}$ cubic centimeters with the preference generally being toward the smaller rather than the larger size. We have found in the practice of this invention that when columns as distinguished from planes are formed by thermomigration, it is convenient to use liquid volumes such that the cross-sectional dimension is of the order of 5 to 10 microns with the preference again being toward the smaller size. In the case of planes, still smaller cross-sectional dimensions are possible.

Figure 2:
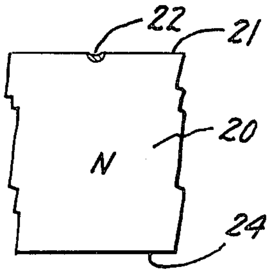
FIG. 2 is a series of views similar to those of FIG. 1 showing a similar deep diode semiconductor device in prior art process production stages corresponding as to time intervals to similar stages of FIG. 1.
Figure 2A:
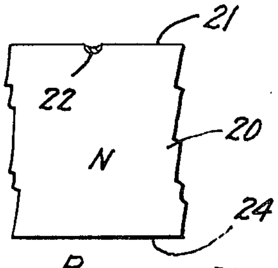
Figure 2B:
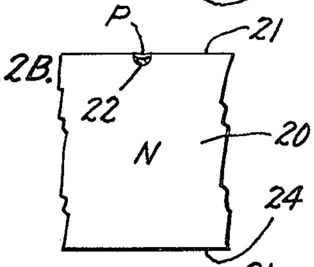
Figure 2C:
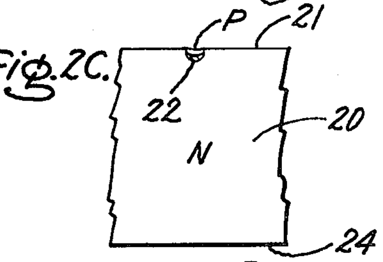

Referring to the drawings, a comparison between migration rates achieved in accordance with this invention and those of the prior art is illustrated in FIGS. 1 and 2 where an N-type silicon single crystal 10 serves as the matrix body in FIG. 1, being provided with a deposit 12 of aluminum in a recess formed in the upper surface 11 of body 10 in accordance with our invention disclosed and claimed in copending application Ser. No. 411,150, filed Oct. 30, 1973. FIGS. 1A, 1B, 1C and 1D illustrate the progress of the thermomigration process as aluminum deposit 12 travels as a liquid body or droplet in a vertical path through body 10, leaving a P-type recrystallized region as a trail behind it and creating a P-N step junction extending downwardly toward lower surface 14 of body 10. Throughout the droplet migration period, the hottest portion of body 10 (the lowermost part) was maintained at 1250°C. The thermal gradient between the coolest (top) and the hottest portions of body 10 was maintained at about 50°C all during the droplet migration period.

Body 20 of FIG. 2 is a single crystal silicon matrix N-type semiconductor like that of FIG. 1 having an upper surface 21 in which a recess is provided and filled with an aluminum deposit 22. Again, FIGS. 2A – 2D illustrate the progress of the thermomigration process as carried out with the hottest portion 24 of body 20 being maintained at 850°C in accordance with the best prior art knowledge and practice, aluminum deposit 22 in the form of a liquid body moving downwardly from surface 21 in the direction of lower surface 24 of body 20. In this case, the thermal gradient between the top and bottom of body 20 was about 100°C during the process.

Figure 1A:
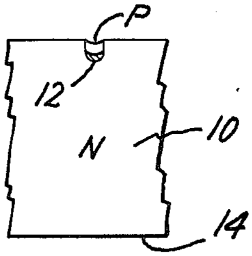
Figure 1B:
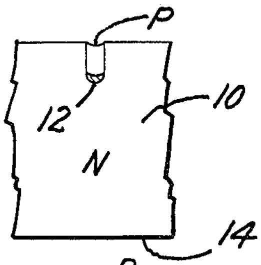
Figure 1C:
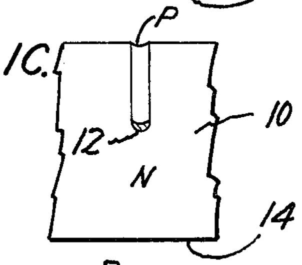
Figure 1D:
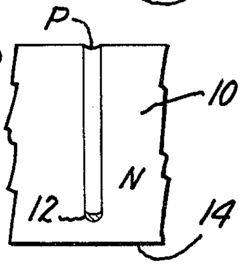
Figure 2D:
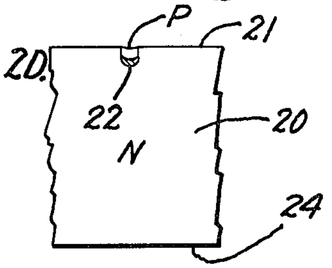

In FIGS. 1 and 2, the process at six-hour intervals is illustrated with the total length of the thermomigration travel course in FIG. 1D representing a distance of 10 centimeters while that of 2D represents one of 0.9 centimeter.

Figure 3:
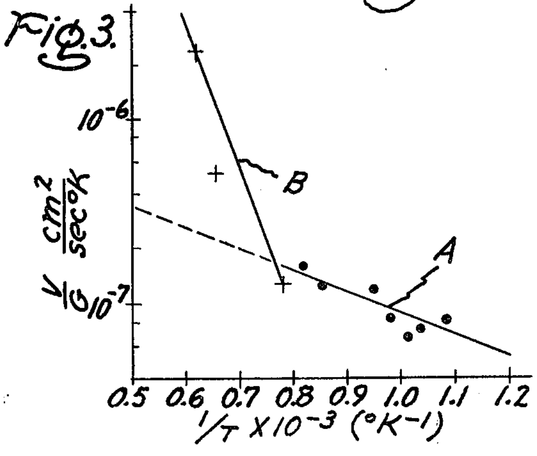
FIG. 3 is a chart on which droplet migration velocity is plotted against the reciprocal of the absolute temperature, the resulting curves illustrating the dramatic effect of the high-temperature operation in accordance with this invention.

The sharp difference between this invention and the prior art in terms of thermomigration rate of droplet travel is indicated by Curves A and B of FIG. 3. Curve A depicts data collected in experiments conducted at a number of different operating maximum temperatures from 750°C to 1000°C, representing prior art practice. Curve B likewise illustrates the data collected in experiments differing from those represented by Curve A only in that the absolute temperatures were in the range from 1000°C 1400°C.

Figure 4:
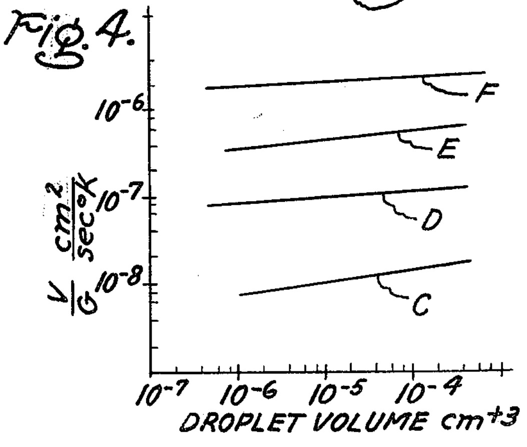
FIG. 4 is a chart on which droplet migration velocity is plotted against droplet volume for four different sets of absolute temperature and thermal gradient conditions.

The relatively limited effect of droplet size on thermomigration droplet travel rate is illustrated by Curves C, D, E, and F of FIG. 4. The range of volume of aluminum particles (i.e., droplets) subjected to the thermomigration process in the four separate experiments represented by the curves is generally the same but the absolute temperatures vary considerably between each series and the thermal gradients are quite different, particularly those of Curves C and F. Thus, in the case of Curve C, the absolute temperature is 876°C and the thermal gradient is 113°C per centimeter. In the runs of Curves D, E and F, absolute temperature is 998°C, 1247°C and 1340°C, respectively, while the thermal gradient (per centimeter) is 47°C, 70°C and 50°C, respectively. In every experiment represented by these four curves, the workpiece is a silicon single crystal wafer one centimeter thick.

The following illustrative, but not limiting, examples will serve to illustrate this invention in more detail for the full understanding of those skilled in the art as to the best mode of practicing it:

EXAMPLE I

A phosphorus-doped, 10 ohm-cm, single crystal 40 cm. long and 2.5 cm. diameter containing $10^4$ dislocations per square centimeter and being of the <111> crystallographic orientation along its cylindrical axis was sliced into a number of wafers one centimeter thick. The wafers were polished to a 3-micron finish and 30-micron deep square holes of various sizes were formed in the top surface of each wafer using the procedure disclosed and claimed in copending application Ser. No. 411,150. An aluminum film 20 microns thick was deposited into the resulting recesses in each wafer by electron beam evaporation from a Temescal Supersource in a vacuum of $10^{-5}$ torr for 30 minutes. The wafers were annealed at 550°C for an hour to insure a strong bond between the aluminum deposits and the silicon and thereafter the excess aluminum between the aluminum-filled recesses was removed by mechanical polishing. Employing the apparatus and process disclosed and claimed in copending application Ser. No. 411,001. The aluminum deposits in the recesses in the wafers were in each instance melted and migrated from the recessed surface to the opposite surface of the wafer, leaving behind a migration trail of recrystallized semiconducting material of P-type.

The conditions employed in carrying out the thermomigration in the several different and separate thermomigration operations involving different wafers of the same batch, the hottest part of the wafer was, respectively, 1150°C, 1200°C, 1250°C, 1300°C, 1350°C, and 1400°C. The thermal gradient in these same runs ranged between 50° and 150°.

It was observed that the aluminum droplet migrated in the (111) crystal as a triangular platelet laying in the (111) plane and bounded on its edges by (112) planes.

The end product deep diode devices, upon examination, proved to have the same crystallized region pattern on both sides, droplet migration being in every instance straight-through and parallel to the axis normal to the opposed faces of the wafer.

EXAMPLE II

In an operation the same as that of Example I with the exception that the silicon single crystal had a <100> crystalline orientation along its cylindrical axis, it was found that the aluminum-rich droplets migrate as pyramids bounded by four forward (111) planes and a rear (100) plane. It was also found that the migration trails or recrystallized doped regions left by some of the droplets indicated that the four (111) facets did not always dissolve at a uniform rate. Such non-uniform dissolution can also result in distortion of the regular pyramid shape of the droplet to a trapezoid shape.

It was further found in the course of this experiment that, as in Example I, droplet migration rate decreases with decreasing droplet size, as indicated by the curve of FIG. 4. However, the decrease in droplet velocity in the case of the (100) orientation is twice that of the (111) orientation so far as droplet size is concerned.

EXAMPLE III

In an experiment designed to illustrate the excellent electrical characteristics of devices made by this invention, a varistor was produced using the procedure described in Example I and the method and apparatus disclosed and claimed in our copending patent application Ser. No. 411,001. Thus, a body of N-type silicon one centimeter thick and of one inch diameter having 10 ohm-centimeter resistivity and a carrier concentration of $5 \times 10^{14}$ atoms per cubic centimeter was subjected to the thermal gradient zone melting process of migrating aluminum droplets, that is, "wires", through the silicon body at high velocity. The method disclosed and claimed in our copending petent application Ser. No. 411,150 was employed to provide the initial droplet source deposits in the desired pattern within a surface of the silicon crystal body. The droplets traveled all the way through the wafer in 12 hours, the thermal gradient being maintained at 50°C/cm and the hot side temperature of the wafer being fixed at 1200°C throughout the migration period. Each of the wire droplet trails was P-type conductivity recrystallized semiconductor material of the body and had a carrier concentration of $2 \times 10^{19}$ atoms per cubic centimeter and a resistivity of $3 \times 10^{-3}$ ohm-centimeter. The recrystallized regions were each 13 mils (330 microns) in thickness. A varistor measuring 0.6 centimeter in width, one centimeter in length and 0.2 centimeter in thickness was prepared from the above-processed body. The varistor had ten P-N junctions and its breakdown voltage was 4500 volts. The varistor showed electrical characteristics qualifying it for use in electric circuits to protect electrical equipment from overvoltages. The resistivity throughout the N- and P-type regions was substantially constant throughout the overall region and the processed body exhibited substantially theoretical physical values for the material used. Upon sectioning and examination, the varistor was found to have sharply-defined P-N junctions, each with a concentration profile of about 0.3 micron width.

In the devices of this invention, the trails left by the migrating droplet are actually regions of recrystallized material extending part way or all the way through the semiconductor matrix body crystal. The conductivity and resistivity of the crystal and the recrystallized region in each instance will be different so that these trails or recrystallized regions will form with the matrix body crystal P-N junctions suitably of the step type if desired. Alternatively, they may serve instead as leadthroughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semiconductive material. It is a semi-conductor material with maximum solid solubility of the impurity therein. It is not semiconductor material which has liquid solubility of the material. Neither is it a semiconductor material which is or contains a eutectic material. Further, such recrystallized region has a constant uniform level of impurity concentration throughout the length of the region or trail and the thickness of the recrystallized region is substantially constant throughout its depth or length.

While in the foregoing examples it has been indicated that the aluminum source of migrating droplet material was deposited under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressures less than $3 \times 10^{-5}$ torr are used in this operation. Similarly, aluminum deposited by sputtering will by virtue of saturation be difficult to use in this process of ours so far as initiation of the droplet penetration action is concerned. It is our preference, accordingly, for an aluminum deposition procedure which prevents more than inconsequential amounts of oxygen from being trapped in the aluminum deposits.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain. In the normal use of the present invention process, the etching operation providing these recesses will be carried on for approximately five minutes at a temperature of 25°C to provide a recess depth of about 25 microns with a window opening size of from 10 to 500 microns according to the size of the opening defined by the mask.

What we claim as new and desire to secure by Letters Patent of the United States is:

1. The high-velocity thermal migration method for making a semiconductor device comprising a matrix body of semiconductor material of selected conductivity and selected resistivity and a plurality of separate spaced recrystallized regions of different selected conductivity and resistivity extending into the interior of the matrix body, which comprises the steps of providing in contact with a first planar surface portion of the matrix body a plurality of separate deposits of a solid metallic material with which the matrix material will form a solution of melting point temperature below that of the matrix material, heating the matrix body and raising the temperature of a second planar surface portion of the body parallel to the first said portion and spaced therefrom to a temperature higher than that of the first said portion and between 1300°C and 1400°C and at the same time heating the metallic material and forming a liquid solution body at the site of each separate deposit, and maintaining the temperature of the second planar surface portion of the matrix body at the stated level while maintaining a thermal gradient between the said first and second planar surface portions of the matrix body, and migrating the resulting liquid bodies from the first planar surface portion toward the second planar surface portion.

2. The method of claim 1 in which the matrix body is a silicon single crystal and the metallic material is aluminum and the temperature of the hottest portion of the matrix body is between 1300°C and 1400°C.

3. The method of claim 1 in which the matrix body is silicon carbide and the metallic material is chromium.

4. The method of claim 1 in which the matrix body is phosphorus-doped silicon and the metallic material is aluminum, and in which the hottest portion of the matrix body is between 1300°C and 1350°C.

5. The method of claim 1 in which the deposits of the metallic material are within recesses in the matrix body and are each of volume from $10^{-9}$ to $10^{-4}$ cubic centimeters.

6. The method of claim 1 in which the matrix body is of silicon and the metallic material is aluminum and the rate of liquid body migration averages approximately $1.2 \times 10^{-4}$ centimeter per second.

7. The method of claim 1 in which the thermal gradient between the first and second portions of the matrix body is between about 10°C and about 150°C per centimeter.

8. The method of claim 1 in which the thermal gradient between the first and second portions of the matrix body is about 50°C per centimeter.

9. The method of claim 1 in which the separate deposits are each a source of a liquid body of the metallic material of volume from about $10^{-9}$ cubic centimeters to about $10^{-4}$ cubic centimeters.

10. The method of claim 1 in which the matrix body is a gallium arsenide single crystal.

* * * * *